United States Patent [19]

Lu et al.

[11] Patent Number: 4,999,317

[45] Date of Patent: Mar. 12, 1991

[54] METALLIZATION PROCESSING

[75] Inventors: Chih-Yuan Lu; Janmye Sung, both of Lower Macungie Township, Lehigh County; Yiu M. Wong, Wescosville, all of Pa.

[73] Assignee: AT&T Bell Laboratories, Murray Hill, N.J.

[21] Appl. No.: 414,888

[22] Filed: Sep. 29, 1989

[51] Int. Cl.$^5$ .............................................. H01L 21/48
[52] U.S. Cl. .................................... 437/189; 437/228; 437/190; 437/192
[58] Field of Search ............... 437/189, 192, 190, 245, 437/228, 235, 246

[56] References Cited

U.S. PATENT DOCUMENTS 4,404,235  9/1983  Tarng et al. .................... 437/245
4,845,050  7/1989  Kim et al. ...................... 437/192

FOREIGN PATENT DOCUMENTS 0267730  5/1988  European Pat. Off. ......... 437/192
62-219945  9/1987  Japan .
2181456  4/1987  United Kingdom .

OTHER PUBLICATIONS

"Thin Film Processes", John Vossen; pp. 401-403, 408-409, 412-425, 1987.
"Thin Layers of TiN and Al as Glue Layers for Blanket Tungsten Deposition", 1987, Materials Research Society, pp. 187-195; Rana et al.
"Tungsten on Conducting Nitride Composite Film"; IBM Technical Disclosure Bulletin; Ahn et al., 8/88, pp. 477-478.

Primary Examiner—Brian E. Hearn
Assistant Examiner—Trung Dang
Attorney, Agent, or Firm—R. D. Laumann

[57] ABSTRACT

When forming a metallization layer in integrated-circuit semiconductor device fabrication, metal such as tungsten, for example, adheres poorly to a dielectric such as, e.g., silicon oxide, and tends to flake off from wafer areas not covered by a glue layer. Processing of the invention prevents such flaking by, first, removing the dielectric from the back side, edge, and "clip-mark" areas of the wafer and, second, depositing a glue layer on remaining dielectric on the face of the wafer. Removal of dielectric material is by etching in the presence of a protective layer on the face of the wafer.

17 Claims, 1 Drawing Sheet

METALLIZATION PROCESSING

TECHNICAL FIELD

The invention is concerned with the manufacture of integrated-circuit devices comprising a metallization.

BACKGROUND OF THE INVENTION

The manufacture of integrated-circuit devices such as, e.g., semiconductor memory and logic chips involves numerous processing steps including ion implantation, deposition of dielectric and conductor layers on a wafer substrate, and photolithographic patterning and etching. More particularly with respect to the deposition of conductor layers on a dielectric, such layers may be formed, e.g., by (physical) sputtering, evaporation, or by chemical vapor deposition (CVD). Prominent in current use are sputtering for aluminum, and chemical vapor deposition for tungsten.

One difficulty encountered especially with respect to conductor metallization layers arises with unsatisfactory adhesion of metallization material to the dielectric, making it advisable, prior to metal deposition, to form an auxiliary, adhesion-enhancing "glue" layer. Since such glue layer is typically deposited by sputtering onto the face of a wafer while the wafer is held by clips, the wafer back side, the wafer edge, and small areas of the wafer face underlying the clips ("clip marks") remain essentially as uncoated dielectric. As a result, subsequently deposited metallization material tends to flake off from such uncoated areas in the course of further processing, thereby contaminating processing apparatus and interfering with desired processing.

The invention described below is motivated by the desire to prevent metal flake-off and attendant contamination and interference.

SUMMARY OF THE INVENTION

A metallization layer is formed on a wafer substrate which at least in part is covered with a dielectric surface layer. Processing prior to metal deposition preferably includes forming a protective layer on an area comprising semiconductor device structures, etching to remove dielectric material from an unprotected area of the wafer, removing the protective layer, and forming an adhesive layer.

DETAILED DESCRIPTION

Figure 1:
FIGS. 1-5 are schematic cross-sectional views of an integrated-circuit wafer structure at sequential exemplary stages of preferred processing in accordance with the invention.

FIG. 1 shows substrate 10, consisting, e.g., of a silicon or Group III-V semiconductor wafer. Substrate 10 typically comprises, at one surface, semiconductor device structures arranged to fit into "chip" regions, to be physically separated later. Semiconductor device structures may comprise regions of doped silicon, contacts to such regions, as well as metal-oxide-semiconductor (MOS) gate structures. Other typical structures include metal-semiconductor field-effect transistors (MESFET), and bipolar junction transistors.

Substrate 10 is covered with layer 11 which consists of a dielectric material such as, e.g., a silicon oxide, $SiO_x$, $0 < x \leq 2$, borosilicate glass, phosphosilicate glass, or borophosphosilicate glass. Silicon oxide may have been formed by deposition, using reagents such as, e.g., silane or tetraethylorthosilicate (TEOS), the latter being particularly suitable also in combination with trimethylborate (TMB) and/or trimethylphosphite (TMP) for forming deposits commonly known as BTEOS, PTEOS and BPTEOS. Further among silicon-oxide precursors are diacetoxyditertiarybutoxysilane (DADBS), diacetoxydiisopropoxysilane (DADIS), and tritertiarybutoxyethoxysilane (TBES). Other than of a material based on silicon oxide, dielectric layer 11 may consist of silicon nitride, for example. Typically, where the dielectric layer overlies device regions, openings or windows are provided for the sake of electric access.

Figure 2:
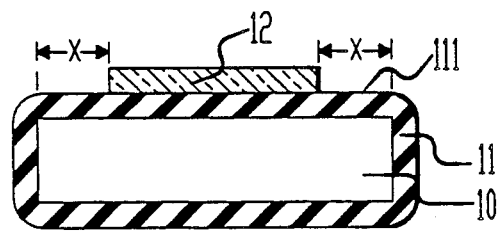

Further to features depicted in FIG. 1, FIG. 2 shows protective layer 12 on the device side of substrate 10, typically consisting of a polymeric material. Conveniently, such material may be a resist material as typically used for photolithographic patterning of metallization layers. Protective-layer material may be spun on, and, preferably, removed by wiping from a peripheral region 111 to allow for clip attachment as used, e.g., in sputter-deposition apparatus. (As described below, sputter deposition is preferred for forming an adhesive layer.) Conveniently, peripheral region 111 is a circumferential region whose width x is chosen adequate for clip attachment.

Figure 3:
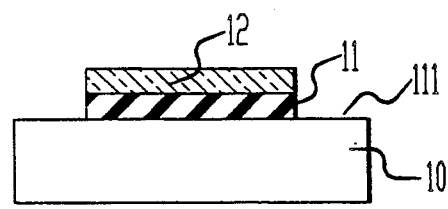

FIG. 3 shows the assembly of FIG. 2 after etching to remove the dielectric from surface areas not covered by protective layer 12, wet etching being preferred in the interest of ease of treatment of the wafer back side and of the wafer edge. Among etchants suitable for dielectric materials based on silicon oxide are (dilute) hydrofluoric acid and buffered hydrofluoric acid; for nitrides, hot phosphoric acid may be used.

Figure 4:
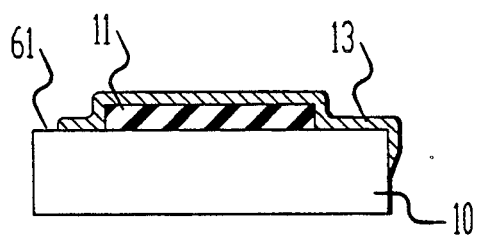
Figure 6:
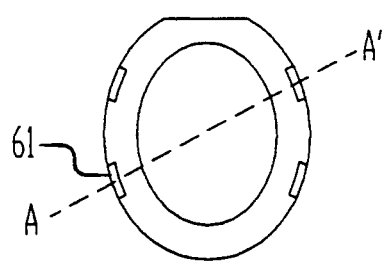
FIG. 6 is a schematic view of an integrated-circuit wafer bearing clip marks.

FIG. 4 shows the assembly of FIG. 3 after stripping of protective layer 12 from the face of the wafer, followed by deposition of glue layer 13 for the purpose of enhanced adhesion of subsequently deposited metal. For example, in the case of tungsten or copper as a metallization material on a silicon-oxide-based dielectric, layer 13 may comprise titanium, titanium nitride, titanium-tungsten, titanium-aluminum, titanium-vanadium, titanium-yttrium, or polycrystalline silicon. Such deposition typically is by sputtering, with the wafer held in deposition apparatus by clips in region 111 of FIG. 3. As a result, clip marks 61 appear at the wafer edge as further illustrated in FIG. 6. (FIG. 4 can be considered as representing a cross section along the line A—A' of FIG. 6)

Figure 5:
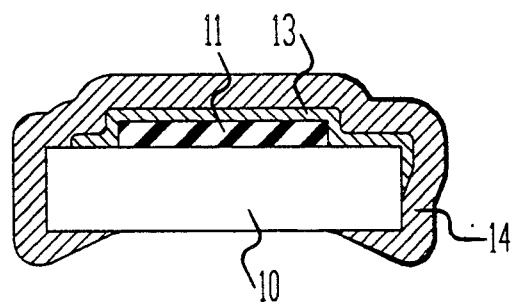

FIG. 5 shows the assembly of FIG. 4 after deposition of metallization layer 14, e.g., by chemical vapor deposition; the material of layer 14 may consist, e.g., of tungsten, copper, or aluminum, and alloyed metallizations are not precluded. Preferred processing in accordance with the invention results in layer 14 being either on glue layer 13 or else on silicon substrate 10, thereby preventing the undesired case of metal in direct contact with the dielectric.

Further processing subsequent to metal deposition is well understood in the art, involving, for example, deposition and photographic exposure of a resist layer on the metallization layer, developing the resist layer to form a pattern, and transfer of a developed pattern into the metallization layer by etching. Alternatively, in cases where metal is deposited for forming electic-connection "plugs" in windows, patterning may be omitted, and etching may proceed, e.g., as disclosed by N. S. Tsai et al., "Layer Tungsten and its Applications of VLSI Interconnects", *IEDM Technical Digest*, 1988, pp. 462-465. Plug connections may be formed also by selective deposition in windows; see, e.g., E. K. Broadbent, "Selective Tungsten Processing by Low-pressure CVD", *Solid State Technology*, December 1985, pp. 51-59.

Exemplary preferred processing of the invention as described above may be compared with alternatively contemplated processing involving, e.g., sputter deposition of a glue layer on the entirety of layer 11 (front, back, and edge of the wafer) prior to metal deposition. With respect to such sputter deposition it is observed that over-all deposition of a glue layer is hampered by the need to turn the wafer over the exposure of its back side, by difficulties in covering the wafer edge, and by the need to repeat the glue-layer deposition process with the wafer rotated for the sake of coating the clip marks. It is apparent, by contrast, that preferred processing of the invention is not subject to such difficulties.

We claim:

1. In the manufacture of integrated-circuit devices, a method for forming a metal layer on a dielectric layer on a substrate comprising a semiconductor-device face, characterized by forming a protective layer on a portion of said dielectric layer on said semiconductor-device face, thereby forming an assembly in which a first area comprising semiconductor device structures is protected, said first area excludes a peripheral region of said face, exposing the resulting assembly to an etchant, thereby removing dielectric material from a second area which is comprised in the complement of said first area, removing said protective layer, forming an adhesive layer on at least said dielectric layer, and forming a metal layer on at least said adhesive layer.

2. The method of claim 1 in which said peripheral region is circumferential.

3. The method of claim 1 in which forming said peripheral region comprises wiping.

4. The method of claim 1 in which said etchant is a wet etchant.

5. The method of claim 1 in which said metal comprises tungsten.

6. The method of claim 1 in which said metal comprises copper.

7. The method of claim 1 in which said metal comprises aluminum.

8. The method of claim 1 in which said dielectric comprises silicon oxide.

9. The method of claim 8 in which said dielectric comprises boron.

10. The method of claim 8 in which said dielectric comprises phosphorus.

11. The method of claim 8 in which said dielectric comprises boron and phosphorus.

12. The method of claim 1 in which said dielectric comprises silicon nitride.

13. The method of claim 1 in which said metal is selected from the group consisting of tungsten and copper, in which said dielectric comprises a silicon oxide, and in which said adhesive layer comprises a material selected from the group consisting of titanium, titanium nitride, titanium-tungsten, titanium-aluminum, titanium-vanadium, titanium-yttrium, and polysilicon.

14. The method of claim 1 in which said protective layer comprises a polymeric material.

15. The method of claim 14 in which said polymeric material is a photoresist material.

16. The method of claim 1 in which said metal is deposited by chemical vapor deposition.

17. In the manufacture of integrated-circuit devices, a method for forming a metal layer on a dielectric layer on a wafer comprising a semiconductor-device face, characterized by forming a protective layer on a portion of said dielectric layer on said semiconductor-device face, thereby forming an assembly in which a first area later to receive a metallization is protected, exposing the resulting assembly to an etchant, thereby removing dielectric material from an unprotected area, and to produce a semiconductor surface adherent to metallization material, said semiconductor surface comprising the backside and the edge of said wafer, and clip marks on the face of said wafer, removing said protective layer to expose dielectric material, forming an adhesive layer at least on now-exposed dielectric material, and forming a metal layer in part on said adhesive layer and in part on semiconductor material, said metal layer thereby adhering satisfactorily and being resistant to flaking.

* * * * *